(12) United States Patent
Kuo (10) Patent No.: US 12,336,356 B2
(45) Date of Patent: Jun. 17, 2025

(54) DISPLAY PANEL

(71) Applicant: Innolux Corporation, Miao-Li County (TW)

(72) Inventor: Shu-Ming Kuo, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 601 days.

(21) Appl. No.: 17/694,693

(22) Filed: Mar. 15, 2022

(65) Prior Publication Data

US 2022/0328744 A1 Oct. 13, 2022

(30) Foreign Application Priority Data

Apr. 12, 2021 (CN) .......................... 202110391116.2

(51) Int. Cl.
*H10H 20/858* (2025.01)
*H01L 25/075* (2006.01)
(Continued)

(52) U.S. Cl.
CPC ..... *H10H 20/8583* (2025.01); *H01L 25/0753* (2013.01); *H10H 20/855* (2025.01);
(Continued)

(58) Field of Classification Search
None
See application file for complete search history.

(56) References Cited

U.S. PATENT DOCUMENTS

| 2014/0302244 | A1* | 10/2014 | Ling | H05B 33/14 |
| | | | | 118/500 |
| 2015/0155450 | A1* | 6/2015 | Oka | H01L 33/60 |
| | | | | 257/98 |

(Continued)

FOREIGN PATENT DOCUMENTS

| CN | 109449177 | 3/2019 |
| CN | 110890453 | 3/2020 |

(Continued)

OTHER PUBLICATIONS

"Office Action of Taiwan Counterpart Application", issued on Apr. 20, 2023, p. 1-p. 9.

(Continued)

*Primary Examiner* — Nicholas J Tobergte
(74) *Attorney, Agent, or Firm* — JCIPRNET (57) ABSTRACT

Provided is a display panel including a first substrate, a light-emitting unit on the first substrate, and a light-converting unit. The light-converting unit converts a first light having a first peak wavelength emitted by the light-emitting unit into a second light having a second peak wavelength. The first peak wavelength is smaller than the second peak wavelength. The light-converting unit includes light conversion particles and first heat dissipation particles. The thermal conductivity of the first heat dissipation particles is greater than 50 $W \cdot m^{-1} \cdot K^{-1}$. Provided is another display panel provided including a first substrate, a light-emitting unit on the first substrate, a pixel define layer on the first substrate, and a separation layer. The pixel define layer includes an opening to accommodate the light-emitting unit. An adhesive layer is on the first substrate. At least one of the pixel define layer and the adhesive layer includes the heat dissipation particles.

18 Claims, 8 Drawing Sheets

(51) Int. Cl.
   *H10H 20/855* (2025.01)
   *H10H 20/80* (2025.01)
   *H10H 20/851* (2025.01)

(52) U.S. Cl.
   CPC ..... *H10H 20/8515* (2025.01); *H10H 20/8581* (2025.01); *H10H 20/882* (2025.01)

(56) References Cited

U.S. PATENT DOCUMENTS

| 2017/0227169 A1* | 8/2017 | Jiang | ............... F21V 3/02 |
| 2019/0186697 A1* | 6/2019 | Jiang | ............... H05B 45/24 |
| 2019/0315921 A1* | 10/2019 | Saito | ............... C08L 83/14 |
| 2020/0227484 A1 | 7/2020 | Lin et al. | |

FOREIGN PATENT DOCUMENTS

| CN | 112133718 | 12/2020 |
| EP | 2214218 | 8/2010 |
| TW | 201031026 | 8/2010 |

OTHER PUBLICATIONS

"Office Action of China Counterpart Application", issued on Feb. 26, 2025, p. 1-p. 7.

\* cited by examiner

DISPLAY PANEL

CROSS-REFERENCE TO RELATED APPLICATION

This application claims the priority benefits of China application serial no. 202110391116.2, filed on Apr. 12, 2021. The entirety of the above-mentioned patent application is hereby incorporated by reference herein and made a part of this specification.

BACKGROUND

Technical Field

The disclosure relates to a display panel, particularly to a display panel that improves heat dissipation or the service life.

Description of Related Art

Electronic devices (e.g., display panels) have been widely used in our daily lives. With the vigorous development of electronic devices, the higher the requirements for display quality, electronic devices continue to improve their display effects with larger or higher resolution.

SUMMARY

According to an embodiment of the present disclosure, the display panel includes a first substrate, a light-emitting unit, and a light-converting unit. The light-emitting unit is disposed on the first substrate. The light-converting unit is adapted to convert a first light provided by the light-emitting unit into a second light. The first light has a first peak wavelength, and the second light has a second peak wavelength. The first peak wavelength is smaller than the second peak wavelength. The light-converting unit includes a plurality of light conversion particles and a plurality of first heat dissipation particles. The thermal conductivity of the first heat dissipation particles is greater than 50 $W \cdot m^{-1} \cdot K^{-1}$.

According to an embodiment of the disclosure, the display panel includes a first substrate, a light-emitting unit, a pixel define layer, and an adhesive layer. The light-emitting unit is disposed on the first substrate. The pixel define layer is disposed on the first substrate and includes an opening for accommodating the light-emitting unit. The adhesive layer is disposed on the first substrate. At least one of the pixel define layer and the adhesive layer includes a plurality of heat dissipation particles.

BRIEF DESCRIPTION OF THE DRAWINGS

The drawings are included for further understanding of the present disclosure, and the drawings are incorporated into this specification and constitute a part of this specification. The drawings illustrate the embodiments of the present disclosure, and together with the description are used to explain the principles of the present disclosure.

DESCRIPTION OF THE EMBODIMENTS

The present disclosure may be understood by referring to the following detailed description in conjunction with the drawings. For readers' understanding and the brevity of the drawings, the drawings of this disclosure only depict part of a light-emitting device, and the specific elements in the drawings are not drawn according to actual scale. In addition, the number and size of each element in the drawings are only for schematic purposes and do not limit the scope of the disclosure.

Throughout the disclosure and the claims, certain words are used to refer to specific elements. Those skilled in the art should understand that electronic device manufacturers may refer to the same components by different names. This article does not intend to distinguish those elements with the same function but different names. In the following description and claims, the words "having" and "including" are open-ended words, so they should be interpreted as meaning "including but the disclosure is not limited to." Therefore, when the terms "including," "containing" and/or "having" are used in the description of the present disclosure, they specify the existence of corresponding features, regions, steps, operations, and/or components, but do not exclude one or more existence of corresponding features, regions, steps, operations, and/or components.

When an element or a film layer is referred to as being "on" or "connected" to another element or film layer, it may be directly on or directly connected to the other element or film layer. Or, there may be an element or film layer intervening between the two (in the case of indirect contact). Conversely, when an element is referred to as being "directly" on or "directly connected" to another element or film layer, there is no element or film layer intervening between the two. In addition, when an element is referred to as "on another element," the two are above or below each other in the top view direction, and this element may be above or below the other element, and this above-or-below relationship depends on the orientation of the device.

Although the terms "first," "second," "third," and the likes may be used to describe various constituent elements, the constituent elements are not limited to these terms. This term is only used to distinguish a single constituent element from other constituent elements in the specification. The same terms may not be used in the claims, and the elements in the claims may be replaced with first, second, third and the likes according to the order declared by the elements in the claims. Therefore, in the following description, the first constituent element may be the second constituent element in the claims.

In the text, the terms "about," "approximately," "substantially," and "substantially" usually mean it is within 10%, 5%, 3%, or 2%, 1%, or 0.5% of a given value or range. The quantity given here is an approximate quantity. In other words, in the absence of a specific description for the terms "about," "approximately," "substantially" or "approximately," "about," and "approximately," the meaning of "substantially" and "substantially" is still implied. In addition, the descriptions "ranging from the first value to the second value" and "between the first value and the second value" imply that the range includes the first value, the second value, and other values in between.

In some embodiments of the present disclosure, terms related to bonding and connection, such as "connected," "interconnected," unless specifically defined, it mean that two structures are in direct contact, or that two structures are not in direct contact and there are other structures located between these two structures. And the terms about joining and connecting can also include the case where both structures are movable or both structures are fixed. In addition, the term "coupled" includes any direct and indirect electrical connection means.

In this disclosure, the thickness, length, and width may be measured by using an optical microscope, and the thickness may be measured by a cross-sectional image in an electron microscope, but it is not limited thereto. In addition, there may be a certain margin in any two values or directions used for comparison. If the first value is equal to the second value, it implies that there may be a margin of about 10% between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees. Without further definitions, all terms (technical and scientific terms included) used herein have the same meanings as commonly understood by those skilled in the art to which this disclosure belongs. It is understandable that these terms, such as those defined in commonly used dictionaries, should be interpreted as having meaning consistent with the relevant technology and the background or context of this disclosure, and should not be interpreted in an idealized or excessively formal way, unless a specific definition is provided in the embodiment of the present disclosure.

The display panel of the present disclosure may be applied to electronic devices such as display devices, antenna devices (e.g., liquid crystal antennas), sensing devices, light-emitting devices, touch devices, splicing devices, or any combination of the foregoing, but the disclosure is not limited thereto. The electronic device may include a bendable and flexible electronic device. The appearance of the electronic device may include a rectangle, a circle, a polygon, a shape with a curved edge, or other suitable shapes. The display device may, for example, include light-emitting diodes (LEDs), liquid crystal (fluorescence), phosphor (phosphor), quantum dot (QD), other suitable materials, or a combination of the foregoing, but the disclosure is not limited thereto. Light-emitting diodes may include, for example, organic light-emitting diodes (OLED), inorganic light-emitting diodes, sub-millimeter light-emitting diodes (mini LEDs), micro LEDs, or quantum dot light-emitting diodes (QLED or QDLED), other suitable materials, or any combination of the above, but the disclosure is not limited thereto. The appearance of the electronic device may have rectangular, circular, polygonal shape, a shape with curved edges, or other suitable shapes. The electronic device may have peripheral systems such as a driving system, a control system, a light source system, a shelf system, to support a display device, an antenna device, or a splicing device. Hereinafter, the display panel will be adapted to illustrate the content of the disclosure, but the disclosure is not limited thereto.

It should be understood that the following embodiments may be substituted, reorganized, and mixed to complete other embodiments without departing from the spirit of the present disclosure. The features between the embodiments may be mixed and matched arbitrarily as long as they do not violate or in conflict with the spirit of the disclosure.

Reference will now be made in detail to the exemplary embodiments of the present disclosure, and examples of the exemplary embodiments are illustrated in the drawings. The same reference symbols may be used to denote the same or similar parts in the drawings and the description.

Figure 1A:
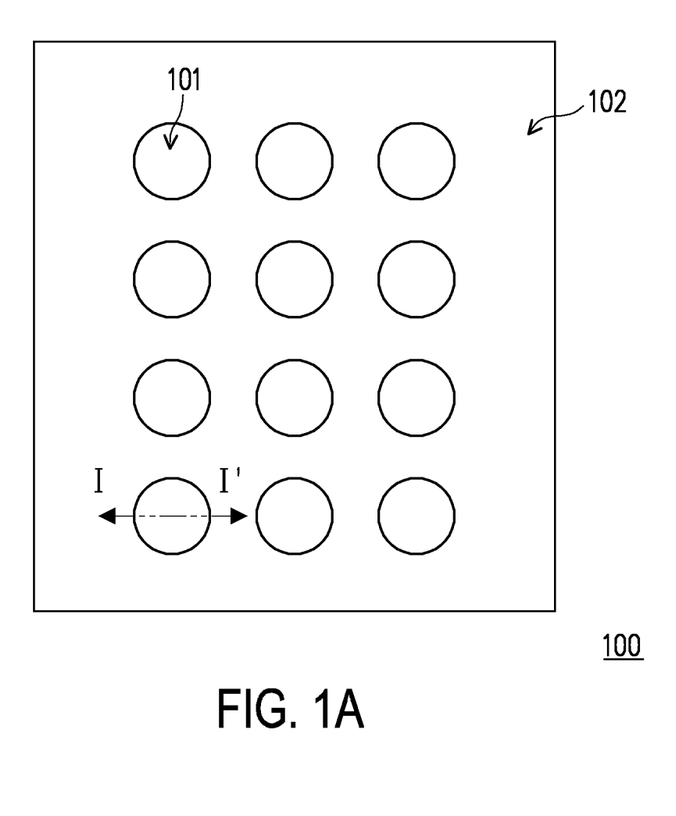
FIG. 1A is a schematic partial top view of a display panel according to an embodiment of the disclosure.
Figure 1B:
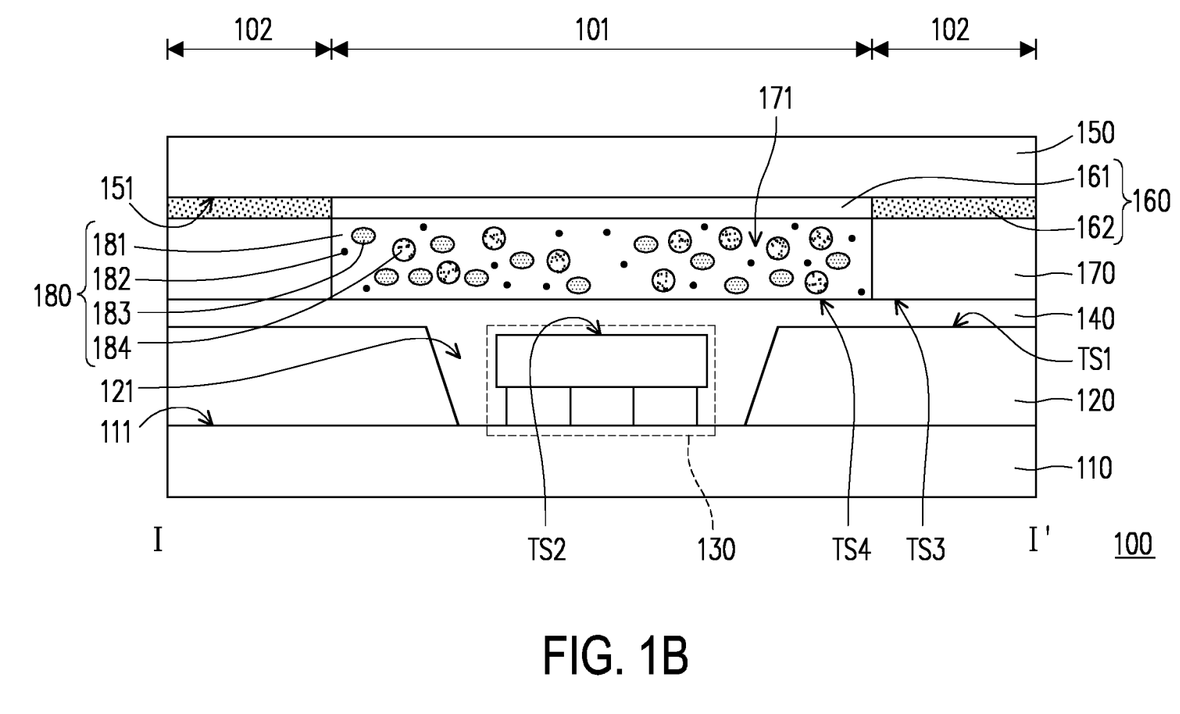
FIG. 1B is a schematic partial cross-sectional view of the display panel of FIG. 1A along the section line I-I'.

FIG. 1A is a schematic partial top view of a display panel according to an embodiment of the disclosure. FIG. 1B is a schematic partial cross-sectional view of the display panel of FIG. 1A along the section line I-I'. For clarity of the drawings and convenience of description, FIG. 1A omits several elements in the display panel.

The display panel 100 of this embodiment has a plurality of light-exit areas 101 and a non-light-exit area 102. The display panel 100 may include a first substrate 110, a pixel define layer 120, a light-emitting unit 130, an adhesive layer 140, a second substrate 150, an optical layer 160, a separation layer 170, and/or a light-converting unit 180, but the disclosure is not limited thereto.

In some embodiments, a pixel define layer (PDL) 120 may be disposed on the first substrate 110 (e.g., a surface 111 of the first substrate 110, and the surface 111 is, for example, adjacent to a surface of the second substrate 150). The pixel define layer 120 may include a plurality of openings 121, and the openings 121 may be adapted to respectively accommodate the light-emitting units 130. In some embodiments, the material of the pixel define layer 120 may include organic materials or inorganic materials, but it is not limited thereto.

In some embodiments, the light-emitting unit 130 may be disposed on the first substrate 110 (e.g., the surface 111 of the first substrate 110), and the light-emitting unit 130 may be disposed in the opening 121 of the pixel define layer 120. The aforementioned description "light-emitting unit 130 may be disposed in the opening 121 of the pixel define layer 120" does not restrict an upper surface TS1 of the pixel define layer 120 to protrude from an upper surface TS2 of the light-emitting unit 130. The upper surface TS1 of the pixel define layer 120 may be selectively cut to be aligned with or lower than the upper surface TS2 of the light-emitting unit 130.

In some embodiments, the light-emitting unit 130 may be disposed corresponding to the light-exit area 101, that is, in the normal direction of the first substrate 110, and the light-emitting unit 130 may overlap the light-exit area 101. In some embodiments, the light-emitting unit 130 may include, for example, red, green, blue, white light-emitting diodes, ultraviolet light-emitting diodes (UV LEDs), and/or light-emitting diodes of other suitable colors, but it is not limited thereto.

In some embodiments, the adhesive layer 140 may be disposed on the first substrate 110 (e.g., the surface 111 of a substrate 110), and at least part of the adhesive layer 140 may be disposed in the opening 121 of the pixel define layer 120. In some embodiments, the adhesive layer 140 may cover the pixel define layer 120 and/or cover the light-emitting unit 130. In some embodiments, the material of the adhesive layer 140 may include optically clear adhesive (OCA), optical clear resin (OCR), other suitable materials, or a combination of the above, but the disclosure is not limited thereto. In some embodiments, the adhesive layer 140 may contact the pixel define layer 120 and/or the light-emitting unit 130, but the disclosure is not limited thereto.

In some embodiments, the second substrate 150 is disposed relative to the first substrate 110. In some embodiments, the first substrate 110 and the second substrate 150 may be attached to each other through an adhesive layer 140. In some embodiments, the first substrate 110 and the second substrate 150 may be respectively located on opposite sides of the adhesive layer 140. The second substrate 150 may have a surface 151 adjacent to the first substrate 110, and the surface 111 of the first substrate 110 may face the surface 151 of the second substrate 150. In some embodiments, the first substrate 110 and/or the second substrate 150 may include a rigid substrate, a flexible substrate, or a combination of the foregoing. For example, the material of the first substrate 110 may include glass, quartz, sapphire, ceramic, polycarbonate (PC), polyimide (PI), polyethylene terephthalate (PET), other suitable materials, or a combination of the foregoing, but the disclosure is not limited thereto.

In some embodiments, the optical layer 160 may be disposed on the second substrate 150 (e.g., the surface 151 of the second substrate 15), and the optical layer 160 may be disposed between the second substrate 150 and the adhesive layer 140. In some embodiments, the optical layer 160 may include a color filter layer 161, a black matrix (BM) 162, and/or other suitable optical layers, but the disclosure is not limited thereto. In some embodiments, the color filter layer 161 may be disposed corresponding to the light-exit area 101 or the light-converting unit 180, and the black matrix layer 162 may be disposed corresponding to the non-light-exit area 102 or the separation layer 170. In other words, in the normal direction of the first substrate 110, the color filter layer 161 may overlap the light-exit area 101, and the black matrix layer 162 may overlap the non-light-exit area 102. In some embodiments, the color filter layer 161 may include red, green, blue filter layers or other suitable color filter layers, but the disclosure is not limited thereto.

In some embodiments, the material of the black matrix layer 162 includes a light-absorbing material, such as a black matrix (BM), but the disclosure is not limited thereto.

In some embodiments, the separation layer 170 may be disposed on the second substrate 150 (e.g., the surface 151 of the second substrate 150), and has a plurality of openings 171. In some embodiments, the separation layer 170 substantially overlaps the black matrix layer 162, and the black matrix layer 162 is located between the second substrate 150 and the separation layer 170. In some embodiments, the separation layer 170 is located between the optical layer 160 (e.g., the black matrix layer 162) and the adhesive layer 140. In some embodiments, the separation layer 170 includes a plurality of openings 171, and the openings 171 may be adapted to respectively accommodate the light-converting unit 180. In some embodiments, the separation layer 170 is disposed substantially corresponding to the non-light-exit area 102, and the opening 171 is disposed substantially corresponding to the light-exit area 101. In other words, in the normal direction of the first substrate 110, the separation layer 170 may overlap the non-light-exit area 102, and the opening 171 may overlap the light-exit area 101. In some embodiments, the material of the separation layer 170 includes light-absorbing materials and/or reflective materials, such as photoresist materials, black matrix (BM), metal materials, other suitable materials, or a combination of the above, but it is not limited thereto.

In some embodiments, the light-converting unit 180 is disposed on the second substrate 150 (e.g., the surface 151 of the second substrate 150), and the light-converting unit 180 may be disposed, for example, in the opening 171 of the separation layer 170. The light-converting unit 180 may be disposed, for example, in the opening 171 of the separation layer 170, and the upper surface TS3 of the separation layer 170 is not limited to protrude from an upper surface TS4 of the light-converting unit 180. The upper surface TS3 of the separation layer 170 may be selectively cut to be aligned with or lower than the upper surface TS4 of the light-converting unit 180.

In some embodiments, the optical layer 160 (e.g., the color filter layer 161) is located between the second substrate 150 and the light-converting unit 180. In some embodiments, the light-converting unit 180 is located between the optical layer 160 and the adhesive layer 140. In some embodiments, the light-converting unit 180 may substantially correspond to the light-exit area 101, that is, in the normal direction of the first substrate 110, and the light-converting unit 180 may overlap the light-exit area 101. In some embodiments, the light-converting unit 180 is adapted to convert the first light provided by the light-emitting unit 130 into the second light, where the first light has a first peak wavelength, the second light has a second peak wavelength, and the first peak wavelength is smaller than the second peak wavelength.

In some embodiments, the light-converting unit 180 includes a polymer 181, a plurality of light conversion particles 182, a plurality of first heat dissipation particles 183, and/or a plurality of scattering particles 184, but the disclosure is not limited thereto. In some embodiments, the light conversion particles 182 include quantum dots, fluorescence, phosphorescence, other suitable materials, or a combination of the foregoing, but the disclosure is not limited thereto. In some embodiments, the scattering particles 184 include titanium oxide ($TiO^2$), other suitable scattering materials, or a combination of the foregoing, but the disclosure is not limited thereto.

In some embodiments, the particle size of the first heat dissipation particles 183 is, for example, between 10 nanometers and 10 micrometers (10 nanometers≤particle diameter≤10 micrometers). For example, it is between 50 nanometers and 8 micrometers (50 nanometers≤particle diameter≤8 micrometers), and between 100 nanometers and 5 micrometers (100 nanometers≤particle diameter≤5 micrometers), but the disclosure is not limited thereto. In some embodiments, the first heat dissipation particles 183 may include boron nitride (BN), aluminum nitride (AlN), silicon carbide (SiC), silicon nitride (Si3N4), beryllium oxide (BeO), aluminum oxide ($Al^2O^3$), and other suitable heat dissipation materials, but the disclosure is not limited thereto. In some embodiments, the thermal conductivity of the first heat dissipation particles 183 may be, for example, greater than 50 $W \cdot m^{-1} \cdot K^{-1}$. For example, it is between 50 $W \cdot m^{-1} \cdot K^{-1}$ and 1000 $W \cdot m^{-1} \cdot K^{-1}$ (50 $W \cdot m^{-1} \cdot K^{-1}$≤thermal conductivity≤1000 $W \cdot m^{-1} \cdot K^{-1}$), but the disclosure is not limited thereto. The first heat-dissipating particles help the light-converting unit 180 or the light-emitting unit 130 to dissipate heat, but it is not limited thereto. For example, the coefficient of thermal conductivity of boron nitride is approximately 185 to 300 $W \cdot m^{-1} \cdot K^{-1}$, the coefficient of thermal conductivity of aluminum nitride is approximately 150 to 220 $W \cdot m^{-1} \cdot K^{-1}$, the coefficient of thermal conductivity of silicon carbide is about 340 $W \cdot m^{-1} \cdot K^{-1}$, and the coefficient of thermal conductivity of beryllium oxide is about 260 to 300 $W \cdot m^{-1} \cdot K^{-1}$, but it is not limited thereto. The given range of the thermal conductivity for each material mentioned above is only an example.

Since the first heat dissipation particles 183 disposed in the light-converting unit 180 help the light-converting unit 180 or the light-emitting unit 130 dissipate heat, the heat generated by the light-converting unit 180 or the light-emitting unit 130 may be reduced, and the service life of the light-converting unit 180 or the light-emitting unit 130 may be increased, thereby increasing the service life of the display panel 100.

In some embodiments, based on the total weight of the light-converting unit 180, the content of the light conversion particles 182 accounts for, for example, 15% to 40% by weight of the light-converting unit 180 (15%≤the content of the light conversion particles 182≤40%); for example, it is between 20% and 35% (20%≤the content of light conversion particles 182≤35%), or between 22% and 38% (22%≤the content of light conversion particles 182≤38%), but the disclosure is not limited thereto. In some embodiments, the content of the first heat dissipation particles 183 accounts for, for example, 1% to 25% by weight of the light-converting unit 180 (1%≤the content of the first heat dissipation particles 183≤25%); for example, it is between 5% and 20% (5%≤the content of the first heat dissipation particles 183≤20%), or between 8% and 17% (8%≤the content of the first heat dissipation particles 183≤17%), but the disclosure is not limited thereto. In some embodiments, when the content of the first heat dissipation particles 183 accounts for more than 25% by weight of the light-converting unit 180, the content of the light conversion particles 182 may be insufficient, resulting in poor light conversion efficiency. In this way, the content of the polymer 181 may be insufficient and the structure of the light-converting unit 180 becomes fragile. In some embodiments, the light-converting unit 180 further includes a plurality of scattering particles 184. The total content of the first heat dissipation particles 183 and the scattering particles 184 accounts for, for example, 5% to 50% by weight of the light-converting unit 180 (5%≤the total content of the first heat dissipation particles 183 and the scattering particles 184≤50%); for example, it is between 10% and 40% (10%≤the total content of the first heat dissipation particles 183 and the scattering particles 184≤40%), or between 15% and 35% (15%≤the total content of the first heat dissipation particles 183 and the scattering particles 184≤35%), but the disclosure is not limited thereto.

In some embodiments, the light-converting unit 180 in the light-emitting unit 130 corresponding to different colors may be used in combination with a plurality of first heat dissipation particles 183 of different content or the same content, but it is not limited thereto. For example, the content of the first heat dissipation particles 183 in the light-converting unit 180 corresponding to the green LED may be greater than the content of the first heat dissipation particles 183 in the light-converting unit 180 corresponding to the red LED, or the content of the first heat dissipation particles 183 in the light-converting unit 180 corresponding to the red LED may be greater than the content of the first heat dissipation particles 183 in the light-converting unit 180 corresponding to the blue LED, but the disclosure is not limited thereto.

Other embodiments are listed below for description. It must be noted here that the following embodiments adopt the element numbers and part of the content of the foregoing embodiments, where the same numbers are used to represent the same or similar elements whose description is omitted hereinafter. Please refer to the foregoing embodiments for the description of the omitted parts, as they are not repeated in the following embodiments.

Figure 2:
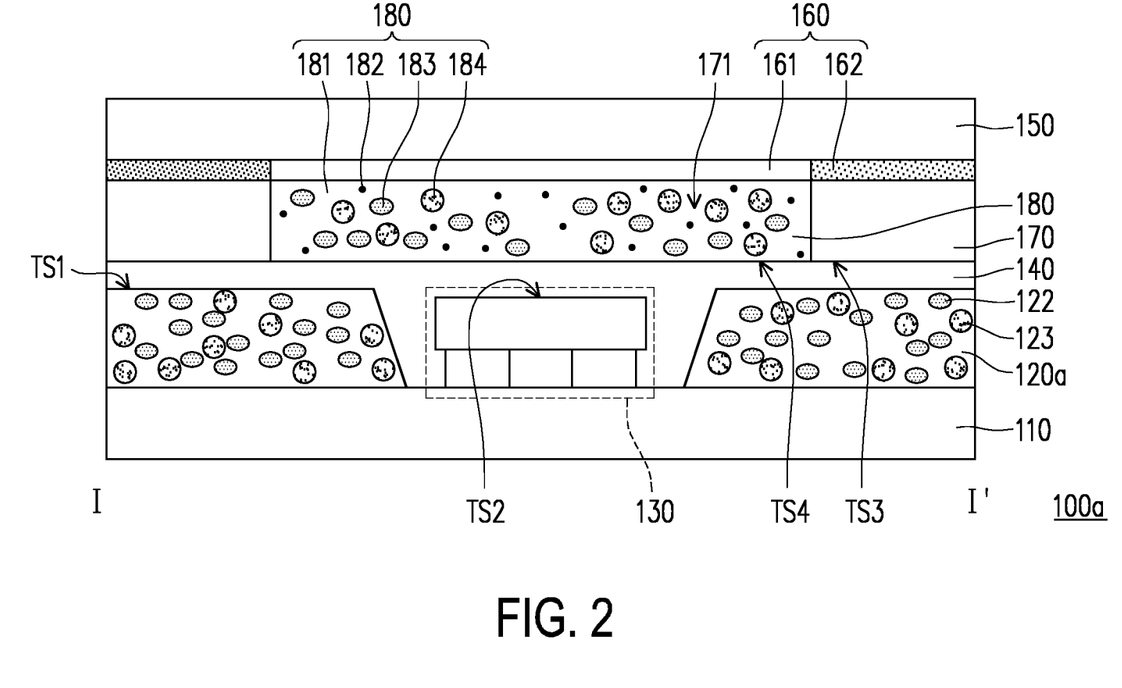
FIG. 2 is a schematic partial cross-sectional view of a display panel according to another embodiment of the disclosure.

FIG. 2 is a schematic partial cross-sectional view of a display panel according to another embodiment of the disclosure. Please refer to FIG. 1B and FIG. 2 at the same time. The display panel 100a of this embodiment is substantially similar to the display panel 100 of FIG. 1B. The descriptions of the same or similar components in the two embodiments are not repeated here. In this embodiment, its main difference from the display panel 100 is that the pixel defining layer 120a of the display panel 100a includes a plurality of second heat dissipation particles 122 and/or a plurality of first light-absorbing particles 123.

In some embodiments, the thermal conductivity of the second heat-dissipating particles 122 is similar to that of the first heat-dissipating particles 183 to help the light-converting unit 180 or the light-emitting unit 130 to dissipate heat, and its description is not repeated here and the disclosure is not limited thereto.

In some embodiments, the first light-absorbing particles 123 may include carbon, dyes, other suitable light absorbing materials, or a combination of the foregoing, but the disclosure is not limited thereto. In some embodiments, the pixel define layer 120a may further include scattering particles, or the first light-absorbing particles 123 in the pixel define layer 120a may be replaced by scattering particles, but the disclosure is not limited thereto.

Figure 3:
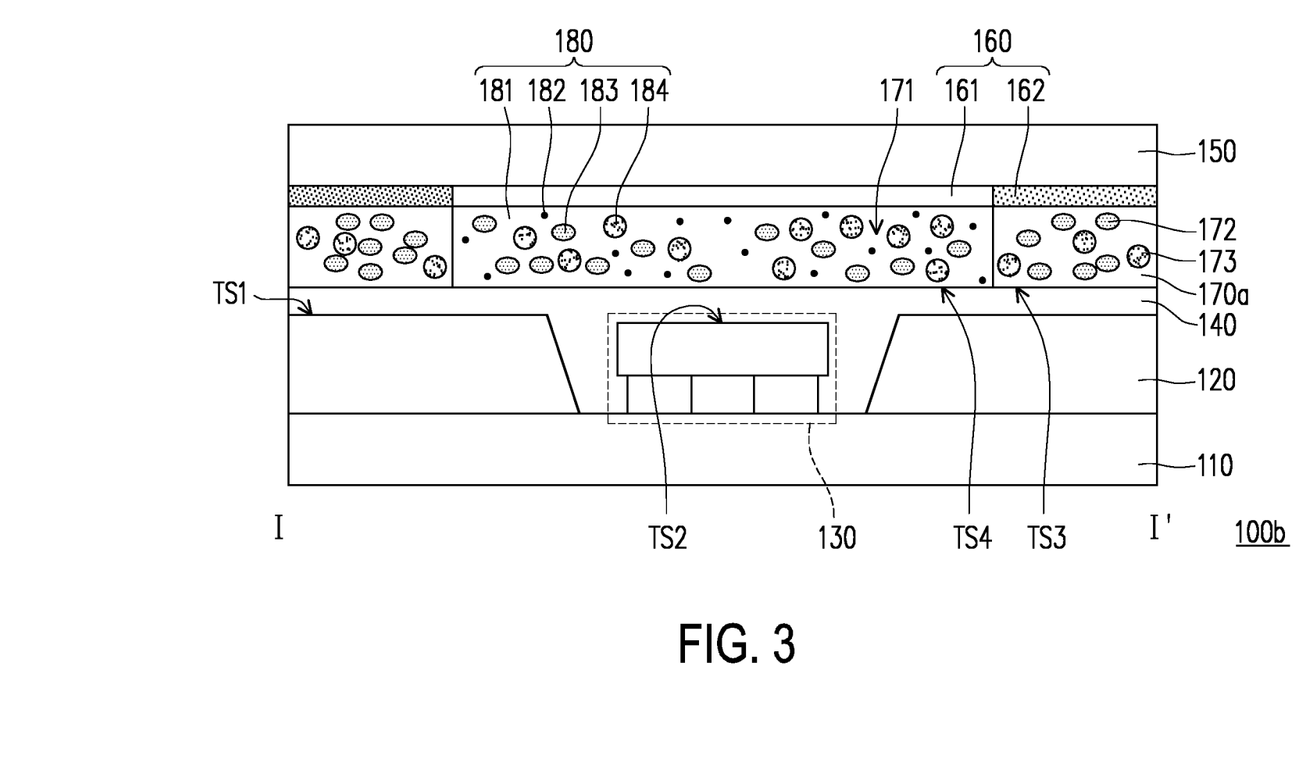
FIG. 3 is a schematic partial cross-sectional view of a display panel according to another embodiment of the disclosure.

FIG. 3 is a schematic partial cross-sectional view of a display panel according to another embodiment of the disclosure. Please refer to FIG. 1B and FIG. 3 at the same time. The display panel 100b of this embodiment is substantially similar to the display panel 100 of FIG. 1B. Therefore, the description of the same or similar components in the two embodiments is not repeated here. In this embodiment, its main difference from the display panel 100 is that the separation layer 170a of the display panel 100b includes a plurality of third heat dissipation particles 172 and/or a plurality of second light absorption particles 173.

In some embodiments, the first light-absorbing particles 123 and/or the second light-absorbing particles 173 include carbon, dyes, other suitable light absorbing materials, or a combination of the foregoing, but the disclosure is not limited thereto. In some embodiments, the separation layer 170a includes scattering particles, or the second light-absorbing particles 173 in the separation layer 170a may be replaced by scattering particles, but it is not limited thereto.

Figure 4:
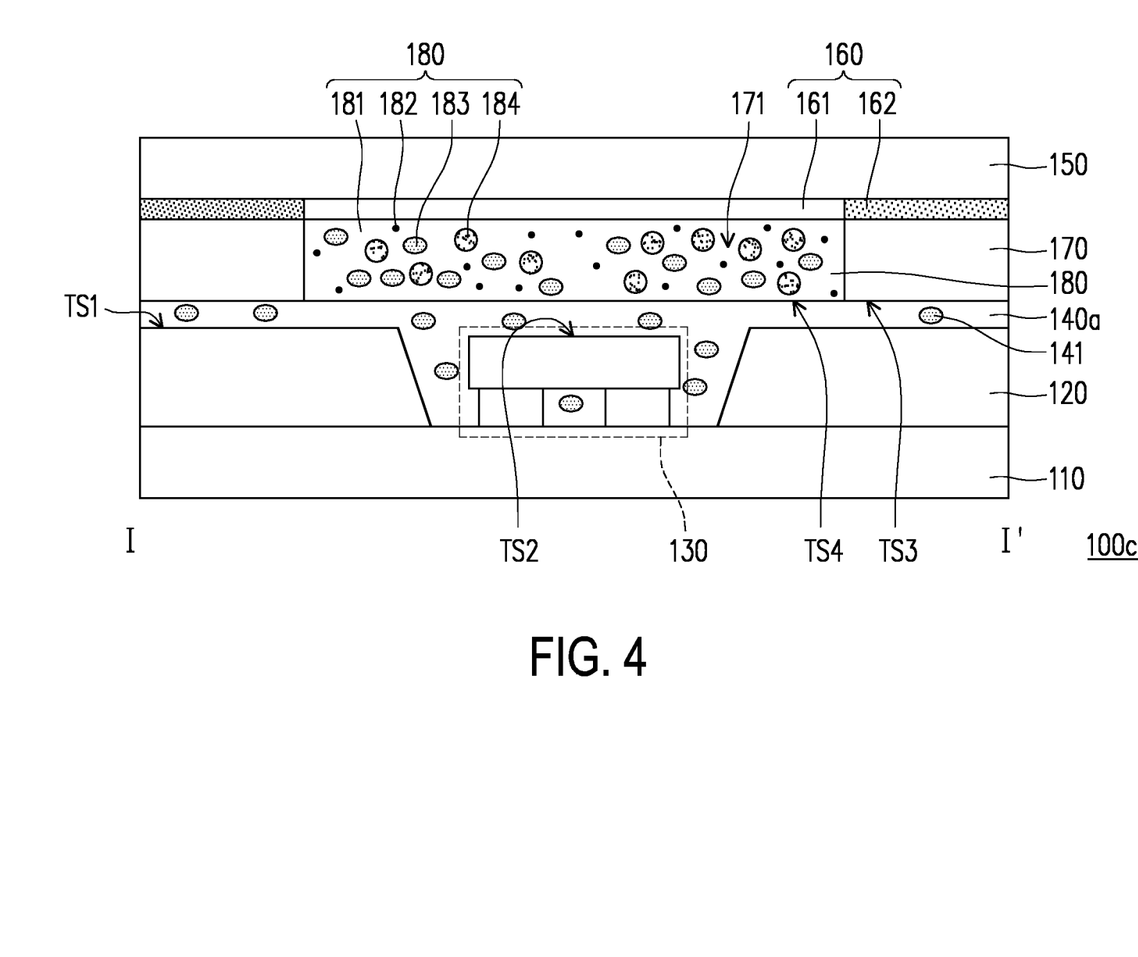
FIG. 4 is a schematic partial cross-sectional view of a display panel according to another embodiment of the disclosure.

FIG. 4 is a schematic partial cross-sectional view of a display panel according to another embodiment of the disclosure. Please refer to FIG. 1B and FIG. 4 at the same time. The display panel 100c of this embodiment is substantially similar to the display panel 100 of FIG. 1B. The descriptions of the same and similar components in the two embodiments are not repeated here. In this embodiment, its main difference from the display panel 100 is that the adhesive layer 140a of the display panel 100c includes a plurality of fourth heat dissipation particles 141.

Note that the particle size, material, and/or thermal conductivity of the first heat dissipation particles 183, the second heat dissipation particles 122, the third heat dissipation particles 172, and/or the fourth heat dissipation particles 141 of the present disclosure may be the same or different, and the description of these features are not repeated herein. The heat dissipation particles help dissipate the heat for the display panel 100c.

Figure 5:
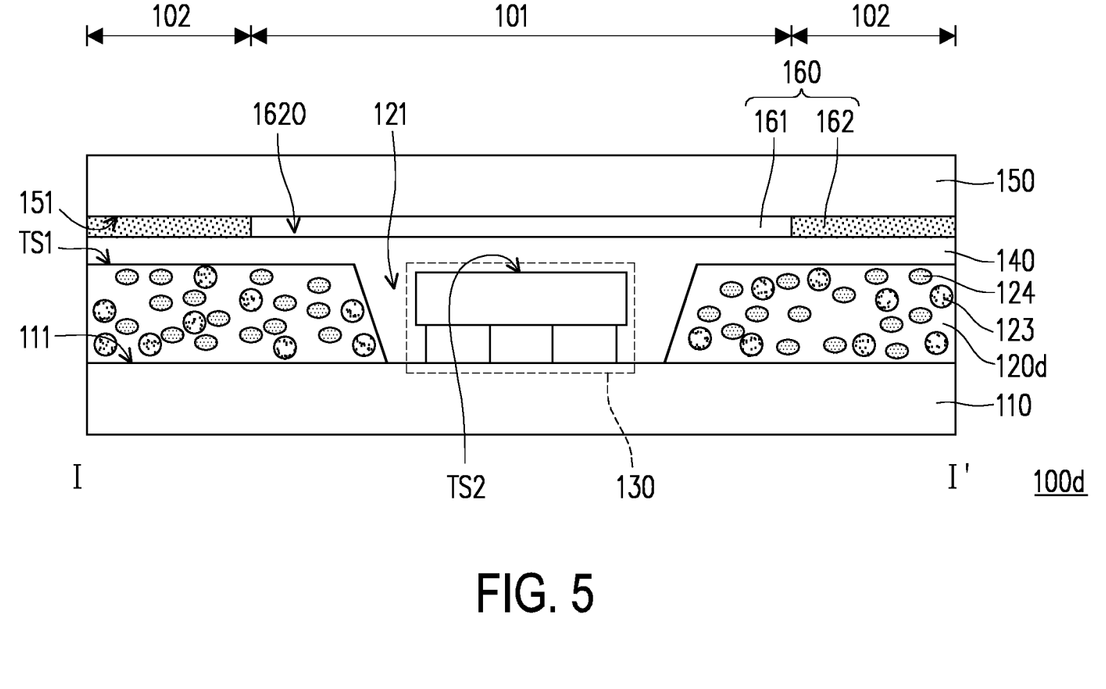
FIG. 5 is a schematic partial cross-sectional view of a display panel according to another embodiment of the disclosure.

FIG. 5 is a schematic partial cross-sectional view of a display panel according to another embodiment of the disclosure. Please refer to FIG. 2 and FIG. 5 at the same time. The display panel 100d of this embodiment is substantially similar to the display panel 100a of FIG. 2, so the description of the same or similar components in the two embodiments is not repeated here. In this embodiment, its main difference from the display panel 100 is that that the display panel 100d does not include the separation layer 170 and/or the light-converting unit 180 in the display panel 100a.

Please refer to FIG. 5 for more details. The display panel 100d of this embodiment has a light-exit area 101 and a non-light-exit area 102. The display panel 100d includes a first substrate 110, a pixel define layer 120d, a light-emitting unit 130, an adhesive layer 140, a second substrate 150, and/or an optical layer 160, but the disclosure is not limited thereto. The pixel define layer 120d may be disposed, for example, on the first substrate 110 (e.g., a surface 111 of the first substrate 110). The pixel define layer 120d may include an opening 121 for accommodating the light-emitting unit 130. The pixel define layer 120d may further include a plurality of first light absorption particles 123 and/or a plurality of heat dissipation particles 124, but the disclosure is not limited thereto. Please refer to, for example, the first heat dissipation particle 183 above for the particle size, material, or thermal conductivity of the heat dissipation particles 124 of some embodiments, which is not repeated here. In some embodiments, the pixel define layer 120d includes scattering particles; alternatively, the first light-absorbing particles 123 in the pixel define layer 120d may be replaced by the scattering particles, but it is not limited thereto.

In some embodiments, the optical layer 160 includes a color filter layer 161 and a black matrix layer 162. The black matrix layer 162 may have a plurality of openings 1620, and the openings 1620 may respectively accommodate the color filter layer 161. In some embodiments, the black matrix layer 162 substantially correspond to the non-light-exit area 102, and the opening 1620 substantially corresponds to the light-exit area 101. In other words, in the normal direction of the first substrate 110, the black matrix layer 162 overlaps the non-light-exit area 102, and the openings 1620 overlap the light-exit area 101.

In some embodiments, the optical layer 160 is disposed between the second substrate 150 and the adhesive layer 140. In some embodiments, the optical layer 160 contacts the adhesive layer 140.

Figure 6:
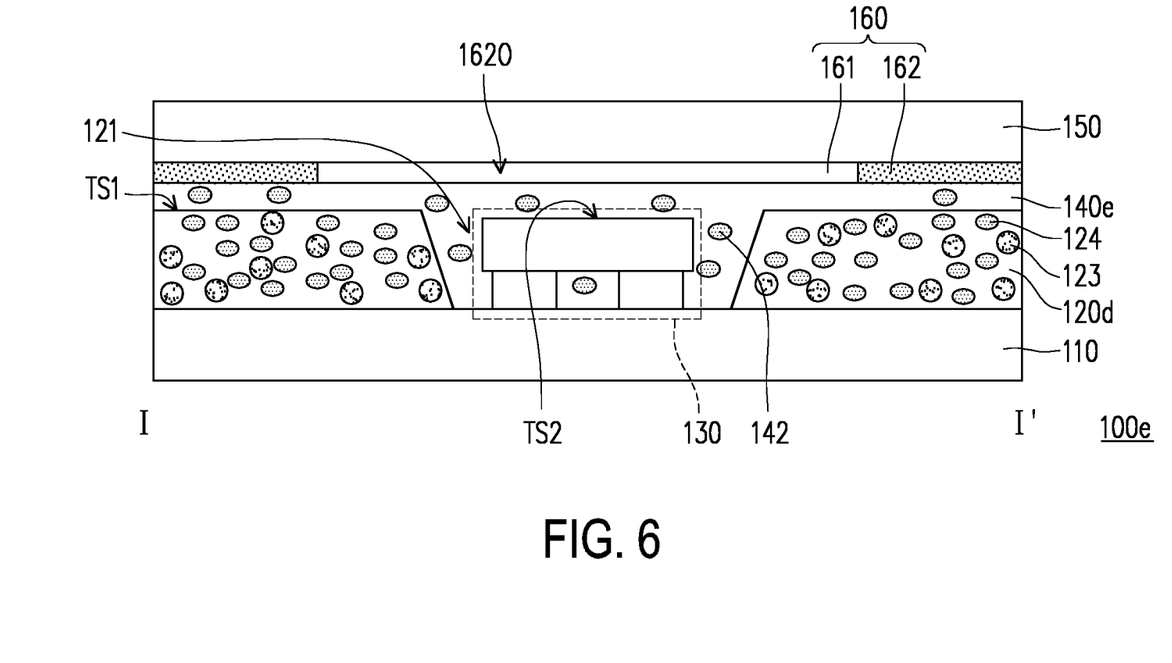
FIG. 6 is a schematic partial cross-sectional view of a display panel according to another embodiment of the disclosure.

FIG. 6 is a schematic partial cross-sectional view of a display panel according to another embodiment of the disclosure. Please refer to FIG. 5 and FIG. 6 at the same time. The display panel 100e of this embodiment is substantially similar to the display panel 100d in FIG. 5, so the description of same and similar components of the two embodiments is not repeated here. In this embodiment, its main difference from the display panel 100 is that the adhesive layer 140e of the display panel 100e includes a plurality of heat dissipation particles 142. In some embodiments, the pixel define layer 120d includes a plurality of first light-absorbing particles 123 and/or a plurality of heat dissipation particles 124. In some embodiments, at least one of the pixel define layer 120d and the adhesive layer 140e optionally includes a plurality of heat-dissipating particles, which helps the light-emitting unit 130 to dissipate heat.

Figure 7:
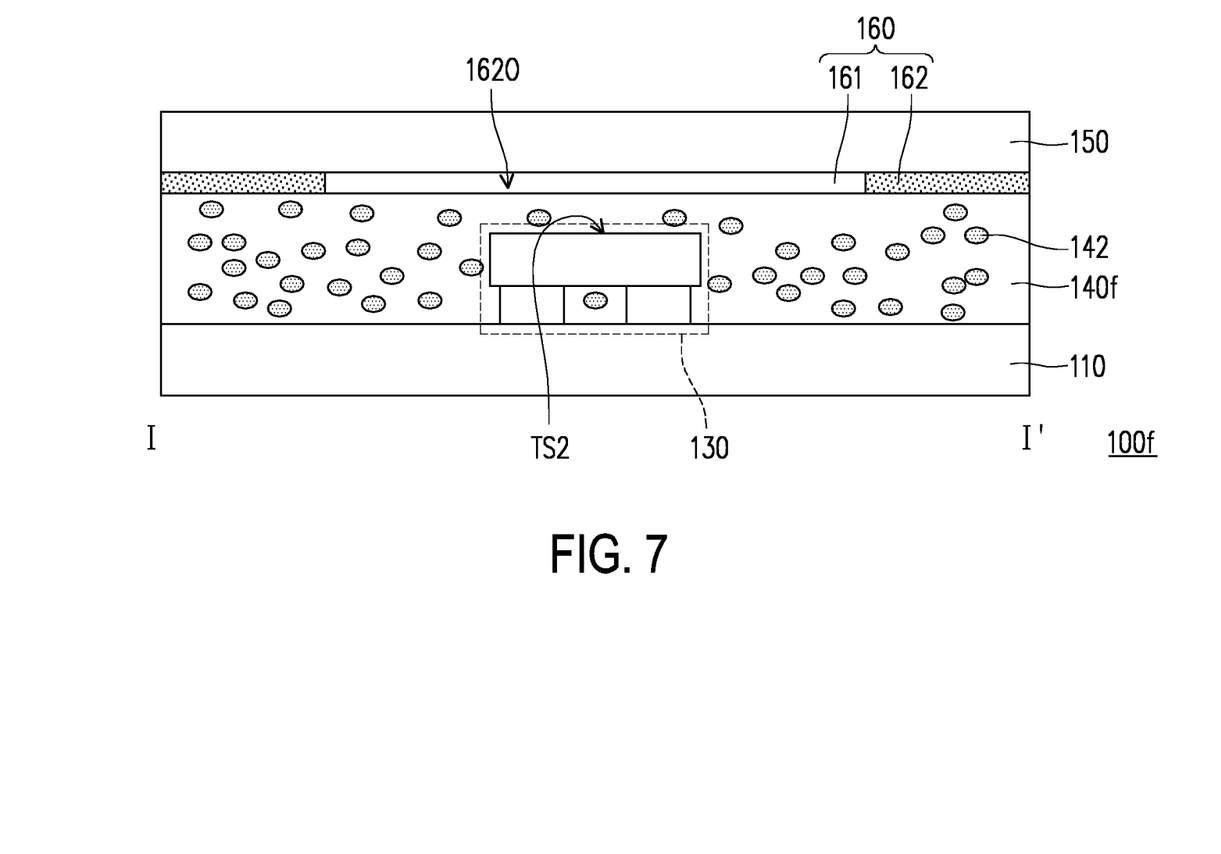
FIG. 7 is a schematic partial cross-sectional view of a display panel according to another embodiment of the disclosure.

FIG. 7 is a schematic partial cross-sectional view of a display panel according to another embodiment of the disclosure. Please refer to FIG. 6 and FIG. 7 at the same time. The display panel 100f of this embodiment is substantially similar to the display panel 100e of FIG. 6, so the description of same and similar components of the two embodiments is not repeated here. In this embodiment, its main difference from the display panel 100e is that the display panel 100f does not include the pixel define layer 120d, the adhesive layer 140f includes a plurality of heat dissipation particles 142, and that the adhesive layer 140f surrounds the light-emitting unit 130. In some embodiments, the light-emitting unit 130 includes, for example, red, green, blue, white light-emitting diodes, ultraviolet light-emitting diodes (UV LEDs), and/or light-emitting diodes of other suitable colors, but it is not limited thereto.

In summary, in a display panel of an embodiment of the disclosure, since the light-converting unit includes a plurality of heat dissipation particles (e.g., the first heat dissipation particles), the thermal conductivity of the first heat dissipation particles is greater than 50 $W \cdot m^{-1} \, K^{-1}$, which helps the light-converting unit or the light-emitting unit in the display panel to dissipate heat, thereby increasing the service life of the display panel. In addition to the light-converting unit that includes a plurality of heat dissipation particles (e.g., the first heat dissipation particles), the pixel defining layer may also include a plurality of heat dissipation particles (e.g., the second heat dissipation particles), the separation layer may include a plurality of heat dissipation particles (e.g., the third heat dissipation particles), and/or the adhesive layer may include a plurality of heat dissipation particles (e.g., the fourth heat dissipation particles), or other suitable layers can include heat-dissipating particles, such that the heat generated by the light-converting unit or the light-emitting unit may be reduced, thereby increasing the service life of the display panel. In addition, in another display panel of the embodiment of the disclosure, since at least one of the pixel define layer and the adhesive layer includes a plurality of heat dissipation particles, and the thermal conductivity of the heat dissipation particles is greater than 50 $W \cdot m^{-1} \cdot K^{-1}$, it help the heat to dissipate in the light-emitting unit in the display panel and increase the service life of the display panel.

Note that the range of the weight percentage of an A material or particles in a certain element (or layer) mentioned in the embodiment of the present disclosure may be detected, for example, by energy-dispersive X-ray spectroscopy (EDS), but the disclosure is not limited thereto. As mentioned above, the weight percentage of the first heat dissipation particles in the light-converting unit 180 is between 1% and 25%, and the element ratio of the first heat dissipation particles 183 in the light-converting unit 180 may be detected by EDS. For example, when the first heat-dissipating particles 183 are boron nitride (BN), the weight percentage may be substantially calculated by calculating the ratio of the elements of boron and nitrogen in the light-converting unit 180 to the overall elements of the light-converting unit 180, but the disclosure is not limited thereto. In addition, since the A material or particles may be substantially distributed uniformly in a certain element or layer, the measurement is performed on, for example, part of the element (or layer) for detection, and it is not limited to perform the measurement on the whole element (or layer).

Finally, note that the above embodiments are only used to illustrate the technical solutions of the present disclosure, but not to limit them. Although the present disclosure has been described in detail with reference to the foregoing embodiments, those of ordinary skill in the art should understand that it is possible to combine and modify the technical solutions described in the foregoing embodiments, or to replace some or all of the equivalent technical features. However, these combinations, modifications, or replacements do not deviate the essence of the corresponding technical solutions from the scope of the technical solutions of the embodiments of the present disclosure.

What is claimed is:

1. A display panel, comprising:
a first substrate;
a light-emitting unit, disposed on the first substrate; and
a light-converting unit, adapted to convert a first light provided by the light-emitting unit into a second light, wherein the first light has a first peak wavelength, the second light has a second peak wavelength, and the first peak wavelength is smaller than the second peak wavelength,
wherein the light-converting unit comprises a plurality of light conversion particles, a plurality of first heat dissipation particles, and a plurality of scattering particles, a thermal conductivity of the first heat dissipation particles is greater than 50 $W \cdot m^{-1} \cdot K^{-1}$, and a weight percentage of the first heat dissipation particles and the scattering particles in the light-converting unit is between 5% and 50%.

2. The display panel according to claim 1, wherein a weight percentage of the first heat dissipation particles in the light-converting unit is between 1% and 25%.

3. The display panel according to claim 1, wherein a material of the first heat dissipation particles comprises boron nitride, aluminum nitride, silicon carbide, silicon nitride, beryllium oxide, or aluminum oxide.

4. The display panel according to claim 1, wherein a particle size of the first heat dissipation particles is between 10 nanometers and 10 microns.

5. The display panel according to claim 1, wherein a material of the scattering particles comprises titanium oxide.

6. The display panel according to claim 1, further comprising:
a pixel define layer, disposed on the first substrate and comprising an opening and a plurality of second heat dissipation particles, wherein the opening is adapted to accommodate the light-emitting unit.

7. The display panel according to claim 6, wherein the pixel define layer further comprises a plurality of first light-absorbing particles.

8. The display panel according to claim 7, wherein a material of the first light-absorbing particles comprises carbon, dyes, or a combination thereof.

9. The display panel according to claim 1, further comprising:
a separation layer, comprising an opening and a plurality of third heat dissipation particles, wherein the opening is adapted to accommodate the light-converting unit.

10. The display panel according to claim 9, wherein the separation layer further comprises a plurality of second light-absorbing particles.

11. The display panel according to claim 1, further comprising:
a second substrate, opposite to the first substrate, wherein the first substrate and the second substrate are attached to each other through an adhesive layer, and the adhesive layer comprises a plurality of fourth heat dissipation particles.

12. The display panel according to claim 11, wherein the adhesive layer is disposed in an opening of a pixel define layer, and the adhesive layer contacts the light-emitting unit.

13. The display panel according to claim 11, further comprising:
an optical layer, disposed on the second substrate, wherein the optical layer is located between the second substrate and the adhesive layer, and the light-converting unit is located between the optical layer and the adhesive layer.

14. The display panel according to claim 13, wherein the optical layer comprises a color filter layer and a black matrix layer, the color filter layer is disposed corresponding to the light-converting unit, and the black matrix layer is disposed corresponding to a separation layer.

15. A display panel, comprising:
a first substrate;
a light-emitting unit, disposed on the first substrate;
a pixel define layer, disposed on the first substrate and comprising an opening for accommodating the light-emitting unit; and
an adhesive layer, disposed on the first substrate, wherein the adhesive layer covers the pixel define layer and the light-emitting unit,
wherein the adhesive layer comprises a plurality of heat dissipation particles.

16. The display panel according to claim 15, wherein the pixel define layer further comprises a plurality of first light-absorbing particles.

17. The display panel according to claim 15, wherein the adhesive layer is disposed in the opening of the pixel define layer, and the adhesive layer contacts the light-emitting unit.

18. A display panel, comprising:
a first substrate;
a light-emitting unit, disposed on the first substrate;
an adhesive layer, disposed on the first substrate and surrounding the light-emitting unit;
an optical layer, disposed on the adhesive layer; and
a second substrate, disposed on the optical layer and opposite to the first substrate,
wherein the adhesive layer comprises a plurality of heat-dissipating particles,
wherein the optical layer comprises a color filter layer and a black matrix layer, the color filter layer is disposed corresponding to a light-exit area, and the black matrix layer is disposed corresponding to a non-light-exit area.

* * * * *